(12) United States Patent
Kawata et al.

(10) Patent No.: US 7,947,328 B2
(45) Date of Patent: May 24, 2011

(54) METAL PATTERN FORMING METHOD

(75) Inventors: Ken Kawata, Minami-ashigara (JP); Seiichi Inoue, Kanagawa-ken (JP); Yasuhiko Maeda, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 428 days.

(21) Appl. No.: 12/238,270

(22) Filed: Sep. 25, 2008

(65) Prior Publication Data
US 2009/0087570 A1    Apr. 2, 2009

(30) Foreign Application Priority Data

Sep. 28, 2007    (JP) ................. 2007-256725

(51) Int. Cl.
*B05D 1/26* (2006.01)
*B05D 1/36* (2006.01)
(52) U.S. Cl. ........ 427/229; 427/226; 427/261; 427/265; 427/266
(58) Field of Classification Search .................. 427/226, 427/229, 261, 265, 266
See application file for complete search history.

(56) References Cited

U.S. PATENT DOCUMENTS

| | | | |
|---|---|---|---|
| 4,927,897 A | | 5/1990 | Kawata et al. |
| 5,055,537 A | * | 10/1991 | Kawata et al. ................. 526/240 |
| 7,279,195 B2 | * | 10/2007 | Kano et al. .................... 427/229 |

FOREIGN PATENT DOCUMENTS

| | | | |
|---|---|---|---|
| JP | 1-131250 A | | 5/1989 |
| JP | 2001-154215 A | | 6/2001 |
| JP | 2002254215 | * | 6/2001 |
| JP | 2002-134878 A | | 5/2002 |
| JP | 2002134878 | * | 10/2002 |

\* cited by examiner

*Primary Examiner* — Frederick J Parker
(74) *Attorney, Agent, or Firm* — Birch, Stewart, Kolasch & Birch, LLP

(57) ABSTRACT

A metal pattern forming method includes the steps of: applying one of a metal salt solution and an acetylene compound solution onto the substrate, the acetylene compound solution containing an acetylene compound expressed by a general formula of:

$$(R\text{-}(C\!\equiv\!C)_l)_k\text{-}(L)\text{-}(A)_m,$$

where R is one of a metal element, hydrogen, a carboxyl group or salt thereof, an alkyl group, a cycloalkyl group, an alkenyl group, an alkynyl group, an aryl group, an aralkyl group and a heterocyclic group, L is one of a compound linking A with a carbon-carbon triple bond and a group having (k+m) valency, A is one of a polyoxyether group, a polyaminoether group and polythioether group, k and l are integers not less than 1, and m is an integer not less than 0; and then applying the other of the metal salt solution and the acetylene compound solution onto the substrate so that the metal salt solution reacts with the acetylene compound solution to form a metal precipitate on the substrate, wherein at least one of the applying steps is performed by using an inkjet apparatus to directly form the metal pattern composed of the metal precipitate on the substrate.

5 Claims, 1 Drawing Sheet

METAL PATTERN FORMING METHOD

BACKGROUND OF THE INVENTION

1. Field of the Invention

The present invention relates to a metal pattern forming method, and in particular, a method for forming a metal pattern by depositing an acetylene compound and an ink liquid containing a metal salt onto a substrate, and synthesizing a metal acetylide on the substrate.

2. Description of the Related Art

In general, a photolithography method (also referred to simply as "photolitho") has been used as a method of forming a metal pattern. In the photolithography method, a resist layer is formed of a dry film resist or liquid resist on a copper clad laminated plate constituted of an insulating layer and copper foil. This resist layer is then irradiated with ultraviolet light through a photomask, and then developed, thereby patterning the resist layer. Thereupon, a metal pattern is obtained by removing the copper foil which is not covered with the patterned resist layer, by means of etching with phosphoric acid, or the like. This method is referred to as a subtractive method. Apart from this method, it is also possible to form a metal pattern by means of a semi-additive method or an additive method. In the semi-additive method or the additive method, a photoresist is patterned in a similar way to the subtractive method, and the patterned photoresist is used as a plating mask.

However, photolithography involves various issues, such as the fact that costs are generally high because it takes a long time of one month or so to make a photo mask, the fact that a large volume of chemicals which are considered to present a considerable environmental burden are used, such as etching liquid, developer liquid, resist stripper, and the like, and the fact that all of the processes are redundant, and so on.

In view of this, Japanese Patent Application Publication No. 2002-134878 discloses a method of forming a metal pattern by patterning an ink of metal particles on a substrate by means of an inkjet or other printing method and then carrying out electroplating. However, the method described in Japanese Patent Application Publication No. 2002-134878 uses a silver colloid dispersion and hence there are concerns with regard to the adhesiveness to the substrate. Furthermore, in order to generate a catalyst, the dispersant on the surface of the silver micro-particles is defatted, but a long heating step of 15 minutes at 150° C. to 300° C. is required for this purpose. Hence, there is a problem in that this method is difficult to apply to a substrate which has poor resistance to heat.

Furthermore, Japanese Patent Application Publication No. 1-131250 discloses a method of polymerizing a metallic compound by heating a metal acetylide compound or by heating an acetylene compound in the presence of a metal element. This method is extremely stable, and has excellent solubility and controllability of the film thickness. This method can be used to form a catalyst film for electroless plating or a conductive film. Moreover, catalytic activity is obtained in a relatively low temperature process without using palladium which is highly expensive, and the adhesive force with respect to the substrate is strong since a chemical change occurs in the heating step and the material reacts with the substrate. Furthermore, a processing step of several seconds to approximately one minute at 100° C. to 180° C. is sufficient, and hence this method can be applied to a substrate having poor resistance to heat.

Moreover, Japanese Patent Application Publication No. 2001-154215 discloses a method of manufacturing a conductive film by applying an application liquid containing a metal acetylide to a supporting body, forming a conductive layer by means of heat treatment, and forming a plating layer on this conductive layer.

In Japanese Patent Application Publication No. 2001-154215, a metal acetylide solution (for example, a silver acetylide solution) is applied by a bar coater to form a conductive layer. However, if the metal acetylide solution could be deposited onto the substrate in the form of droplets by means of an inkjet apparatus, then a great merit would be obtained in that a metal pattern could be printed directly onto the substrate.

There is no problem if using an application apparatus, such as a bar coater, as an apparatus for applying a metal acetylide solution onto a substrate, as in Japanese Patent Application Publication No. 2001-154215. However, if it is sought to print a metal pattern, such as a pattern for a plating catalyst or a conductive pattern for an electrical circuit, or the like, directly onto a substrate by depositing metal acetylide solution from the nozzle section of an inkjet apparatus as the depositing apparatus, then the following problems occur.

(1) If a σ complex is used as a silver salt monomer, then the monomer is precipitated by liquid evaporation and condensation in the nozzle section, and therefore nozzle blockages and ejection failures are liable to occur.

(2) If a π complex is used as a silver salt monomer, then since the π complex is thermally instable, it suffers severe decomposition upon assuming a solvent-free state, and therefore has not allowed stable use. Moreover, during inlet ejection, with the passage of time, the silver mirror is produced inside the head and the flow channel becomes sealed.

Furthermore, it has not been possible to eliminate general problems which are intrinsic to inkjet systems, namely, the problem of wetting and spreading of the deposited ink which prevents the formation of fine patterns, the mutual interference between deposited droplets and the consequent decline in patterning accuracy.

SUMMARY OF THE INVENTION

The present invention has been contrived in view of these circumstances, an object thereof being to provide a method of forming a metal pattern whereby, even if using an inkjet apparatus as the apparatus for forming a metal acetylide having excellent properties which combine good adhesiveness to the substrate and good catalytic activity, on a substrate, in a short time and at a relatively low temperature, blocking of the nozzle sections, ejection failures, and sealing up of the flow channels, and the like, do not arise, and therefore a metal pattern such as a pattern for a plating catalyst or a pattern for an electrical circuit, for example, can be printed directly onto a substrate.

In order to attain the aforementioned object, the present invention is directed to a metal pattern forming method of forming a metal pattern on a substrate, the metal pattern forming method comprising the steps of: applying one of a metal salt solution and an acetylene compound solution onto the substrate, the acetylene compound solution containing an acetylene compound expressed by a general formula of:

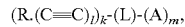

where R is one of a metal element, hydrogen, a carboxyl group or salt thereof, an alkyl group, a cycloalkyl group, an alkenyl group, an alkynyl group, an aryl group, an aralkyl group and a heterocyclic group, L is one of a compound linking A with a carbon-carbon triple bond and a group having (k+m) valency, A is one of a polyoxyether group, a polyaminoether group and polythioether group, k and l are integers not less than 1, and m is an integer not less than 0; and after the step of applying the one of the metal salt solution and the acetylene compound solution, applying the other of the metal salt solution and the acetylene compound solution onto the substrate so that the metal salt solution reacts with the acetylene compound solution to form a metal precipitate on the substrate, wherein at least one of the applying steps is performed by using an inkjet apparatus to directly form the metal pattern composed of the metal precipitate on the substrate.

In this aspect of the present invention, the two types of solutions, a metal salt solution and an acetylene compound solution are applied separately onto the substrate to form the metal precipitate on the substrate. Therefore, the two solutions are not mixed with each other before the application onto the substrate and hence a monomer of the metal salt does not form and even if an inkjet apparatus is used, it is possible to prevent blockages of the nozzles. Consequently, it is possible to achieve stable ejection of the solution.

Furthermore, since the second liquid (i.e., the other of the metal salt solution and the acetylene compound solution) is patterned on top of the thin layer of the first liquid (i.e., one of the metal salt solution and the acetylene compound solution), then the application object onto which the second liquid is to be applied is always the thin layer of the first liquid (even when the type of the substrate is changed). Consequently, patterning is possible regardless of the type of substrate, and a metal pattern can be formed in a stable fashion. Moreover, by depositing both of the two solutions by means of an inkjet apparatus, it is possible to reduce the amount of solution used, as well as achieving a uniform film thickness.

Preferably, in the step of applying the one of the metal salt solution and the acetylene compound solution, the one of the metal salt solution and the acetylene compound solution is applied onto the substrate in a form of a thin film by using an application apparatus; and in the step of applying the other of the metal salt solution and the acetylene compound solution, the other of the metal salt solution and the acetylene compound solution is deposited onto the thin film by using the inkjet apparatus to form the metal pattern on the substrate.

In this aspect of the present invention, a thin film layer is formed by applying one of the two solutions onto the substrate, whereupon a metal pattern is patterned by depositing droplets of the other solution by using an inkjet apparatus. Consequently, it is possible to print a target metal pattern directly onto the substrate (it is possible to form a metal pattern without using a resist pattern, for example).

Moreover, when the acetylene compound and the metal salt react together, firstly, a metal acetylide π complex is formed. This metal acetylide π complex produces a vigorous reaction which generates heat, and therefore at the depositing points of the ejected ink droplets, the reduction reaction occurs rapidly to generate the metal precipitate (the metal acetylide is solidified), thus preventing undesirable spreading of the deposited droplets or interference between deposited droplets. Consequently, it is possible to improve the accuracy of the metal pattern.

Preferably, the above-described metal pattern forming method further includes the step of heating the substrate after the metal salt solution is applied on the substrate in one of the applying steps.

In cases where the metal salt solution is applied as the first liquid (i.e., one of the metal salt solution and the acetylene compound solution), it is possible to dry the solvent of the metal salt solution and to precipitate the metal salt on the substrate by heating the substrate on which the metal salt solution has been applied. By then depositing an acetylene compound solution, it is possible to promote the formation of the metal precipitate on the substrate. Furthermore, by heating after depositing the first liquid and the second liquid, a portion of the acetylene compound is decomposed due to the heat and a reducing group is generated. Due to this effect, the silver is reduced to form the metal precipitate, and hence a metal pattern can be formed.

Preferably, in the step of heating the substrate, the substrate is heated at a temperature of 100° C. through 180° C. for one minute or less.

In this aspect of the present invention, it is possible to form a desirable metal pattern. Moreover, since processing can be carried out at a low temperature and in a short time compared to a method in the related art, then the method can also be applied to a substrate which has poor resistance to heat.

Preferably, the above-described metal pattern forming method further comprises the step of performing a plating process after the metal precipitate is formed on the substrate, and the metal salt solution contains a metal element belonging to one of groups 8 to 10 in a periodic table.

When forming a metal pattern by printing directly using an inkjet method, since the amount of deposited solution is small, then the film is formed to a very thin thickness of 1 μm or less. In the above aspect of the present invention, by carrying out a plating process after forming the metal precipitate on the substrate, it is possible to increase the thickness of the metal pattern readily. Furthermore, in order to increase the film thickness by means of a plating process, it is desirable that the metal salt solution should use a solution of a precious metal salt including an element belonging to one of group 8, group 9 and group 10 in the periodic table.

According to the present invention, since a metal acetylide is synthesized on a substrate by applying two types of solutions, a metal salt solution and an acetylene compound solution onto the substrate, then there is no mixing of the two solutions before being applied onto the substrate. Consequently, problems such as ejection failure in the nozzle section do not occur, even when using an inkjet apparatus to apply at least one of the two solutions. Therefore, it is possible to print a metal pattern directly with a high degree of accuracy, by means of an inkjet apparatus.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Figure 1A:
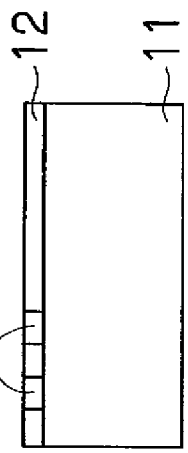
FIGS. 1A to 1F are diagrams for describing a metal pattern forming method according to an embodiment of the present invention.

The method of forming a metal pattern according to an embodiment of the present invention forms a desired metal pattern by depositing two types of solution, namely, a metal salt solution and an acetylene compound, separately onto a substrate, thereby synthesizing a metal acetylide compound on the substrate and precipitating metal particles. In this case, at least one of the metal salt solution and the acetylene compound is deposited by means of an inkjet apparatus to print a metal pattern directly onto the substrate.

Metal Salt Solution

Firstly, the metal salt solution will be described. The metal in the metal salt solution according to the present embodiment is an element belonging to group 8, group 9, group 10 or group 11 of the periodic table. For example, nickel, ruthenium, rhodium, palladium, platinum, copper, silver, gold, or the like, can be used as the metal in the metal salt solution, and it is preferable to use silver or copper. Furthermore, it is also possible to use one type of metal independently, or to use a combination of two or more types of metal. The metal of this kind is used in the form of a metal salt or metal complex, and as a metal salt, it is desirable to use silver nitrate, silver acetate, silver boron tetrafluoride, palladium chloride, copper (I) chloride, platinum chloride, or the like. Furthermore, for the metal complex, it is possible to use a di-μ-chloro-bis(η-2-methylallyl)dipalladium (II) complex, a tetrakis(triphenyl phosphine)palladium complex, a di-μ-chlorotetracarbonyl dirhodium (I) complex, 1,4,7,10,13-pentaoxy cyclododecane-sodium tetrachlor vanadinite, dicyclopentadiene-gold (I) chloride, or the like.

For the organic solvent which dissolves the metal salt or the metal complex described above, it is possible to use any solvent which dissolves the metal salt and metal complex without any particular restrictions, provided that it dissolves the metal salt monomer which is formed after deposition on the substrate. For example, possible solvents are: water, an alcohol such as methanol, ethanol or isopropyl alcohol, a ketone such acetone or methyl ethyl ketone, a halogen compound such as chloroform or methylene chloride, an ester such as ethyl acetate, an amide such as dimethyl acetoamide, dimethyl formamide or N-methyl-2-pyrrolidone, a nitrile such as acetonitrile, an ether such as diethyl ether or ethyl methyl ether, or an acetate such as methoxy ethyl acetate, methoxy propyl acetate, or the like.

There are no particular restrictions on the concentration of the metal salt and the metal complex, but in consideration of the uniformity of the film of the metal pattern after formation, it is desirable that the concentration of the metal salt or the metal complex should be low.

Acetylene Compound Solution

Next, the acetylene compound solution will be described. The acetylene compound solution is a solution that contains an acetylene compound which is expressed by the following general formula (1):

$$(R.(C\equiv C)_l)_k\text{-}(L)\text{-}(A)_m \quad (1),$$

where R is one of a metal element, hydrogen, a carboxyl group or salt thereof, an alkyl group, a cycloalkyl group, an alkenyl group, an alkynyl group, an aryl group, an aralkyl group and a heterocyclic group, L is one of a compound linking A with a carbon-carbon triple bond and a group having (k+m) valency, A is one of a polyoxyether group, a polyaminoether group and polythioether group, k and l are integers not less than 1, and m is an integer not less than 0

As an alkyl group usable as "R" in the general formula (1), an alkyl group having a carbon number of 1 to 10 is desirable, and the alkyl group may be a straight chain group or branched group. Furthermore, for the cycloalkyl group, an cycloalkyl group having a carbon number of 5 to 6 is desirable. For the alkenyl group, an alkenyl group having a carbon number of 2 to 10 is desirable and the alkenyl group may be a straight chain group or a branched group. For the alkynyl group, an alkynyl group having a carbon number of 2 to 10 is desirable, and the alkynyl group may be a straight chain group or a branched group. For the aryl group, an aryl group having a carbon number of 6 to 10 is desirable. For the aralkyl group, an aralkyl group having a carbon number of 7 to 10 is desirable. For the heterocyclic group, a heterocyclic group having a five-membered ring or six-membered ring including a nitrogen atom, a sulfur atom or an oxygen atom, is desirable. The alkyl group, cycloalkyl group, alkenyl group, alkynyl group, aryl group, aralkyl group and heterocyclic group which are represented by R may be respectively substituted, and possible examples of the substitute group are a hydroxyl group, an acetyl group, an epoxy group, a carboxyl group, sulfonic acid, or the like.

Moreover, a metal element usable as "R" in the general formula (1) may be a metal belonging to group 1 of the periodic table apart from hydrogen (namely, an alkali metal), a metal belonging to group 11 (copper group), group 2 (alkali earth metal), group 12 (zinc group), group 13 apart from boron, group 14 apart from carbon and silicon, groups 8, 9 and 10 (iron group and platinum group), group 3, group 4, group 5, group 6, group 7, or antimonial, bismuth or boronium.

Furthermore, "A" in the general formula (1) may be substituted with a hydroxy group, an amino group, a mercapto group, a sulfino group or salt thereof, a sulfo group or salt thereof, a carboxyl group or salt thereof, or a polymerizable group. Possible examples of the polymerizable group are a glycidyl group, a vinyl group, an isocyanate group, or the like.

"L" in the general formula (1) is a chemical compound which links A with a carbon-carbon triple bond, or a group of (k+m) valency. For example, "L" includes an alkylene group, an aryl group, an aralkylene group, a vinylene group, a cycloalkylene group, a glutaroyl group, a phthaloyl group, a hydrazo group, a ureylene group, a thio group, a carbonyl group, an oxy group, an imino group, a sulfinyl group, a sulfonyl group, a thiocarbonyl group, an oxalyl group, an azo group, or the like, each of which may be substituted. Furthermore, any of the groups described above may be a group which combines two or more types of group. L may be substituted with various substitute groups, and possible examples of substitute groups are those given as examples of substitute groups for "A".

"k" and "l" in the general formula (1) are integers which are equal to or greater than 1. Desirably, "k" is an integer between 1 and 4 and "l" is an integer of 1 or 2. Furthermore, "m" is an integer equal to or greater than 0, and desirably an integer of 1 to 3.

Moreover, as described above, the compound represented by the general formula (I) desirably includes at least one of a polyoxyether group, a polyaminoether group and a polythioether group, and in particular, it includes a polyoxyether group. By using an acetylene compound having a group of this kind, since the compound itself, or the compound in the form of a mixture with a metal element, has high solubility with respect to an organic solvent, then it is possible readily to obtain a metal-containing polymer in the form of a uniform film or fiber.

Desirable concrete examples of a monomer are given below, but the present invention is not limited to these.

 (1)

 (2)

-continued

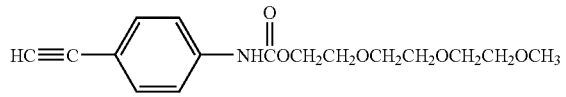
(3)

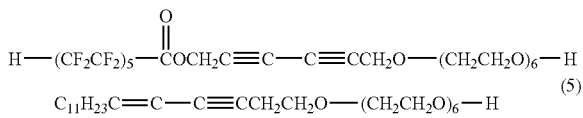
(4)

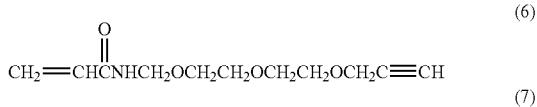
(5)

(6)

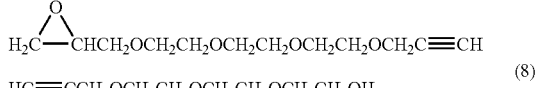
(7)

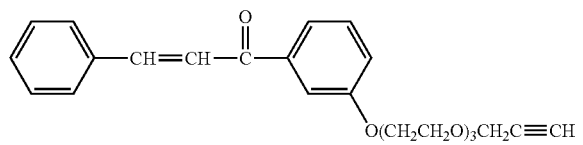
(8)

HC≡CCH₂OCH₂CH₂OCH₂CH₂OCH₂CH₂OH
(9)

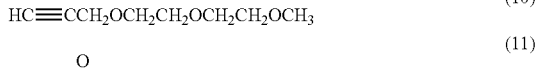
(10)

HC≡CCH₂OCH₂CH₂OCH₂CH₂OCH₃
(11)

(12)

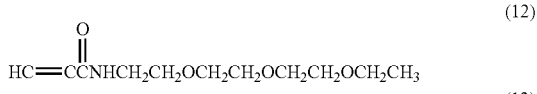
(13)

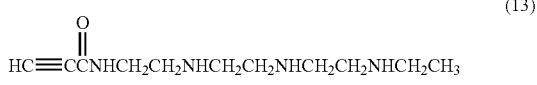
(14)

(CH≡CCH₂OCH₂)₃—CCH₂OCH₂CH₂OCH₂CH₂OCH₂CH₂OCH₂CH₃
(15)

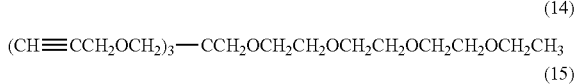
(16)

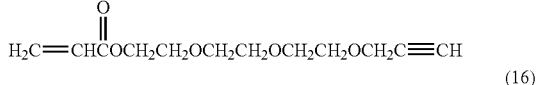

Of these compounds, the compound (1) is desirable as an acetylene compound.

The acetylene compound solution may contain an organic solvent similar to that of the metal salt solution. In this case, the concentration of the organic solvent in the acetylene compound solution may be similar to the case of the metal salt solution.

Furthermore, it is also possible to include a surfactant in the metal salt solution and the acetyl compound solution described above, in order to improve the dispersibility and/or the solubility of the solution. Possible examples of the surfactant are a fluorine-based, ammonium salt-based, sulfonic acid salt-based, or ethylene oxide-based surfactant, or the like. Apart from this, it is also possible to include a binder resin, a plasticizer, a viscosity enhancer, or the like.

Substrate

For the substrate used in the present invention, it is necessary to use a material which withstands the formation of a metal pattern. Possible examples of the substrate are copper, iron, titanium, glass, quartz, ceramics, carbon, polyethylene, polyphenol, polypropylene, ABS polymer, epoxy resin, glass fiber-reinforced epoxy resin, polyester, polyamide, polycarbonate, polyolefin, polyacrylonitrile, a polyvinyl halide, polyethylene terephthalate, polyethylene naphthalate, polyimide, polyether ether ketone, cotton, wool or mixtures of same, or a fiber sheet (including cloth) of a copolymer of the aforementioned monomers, thread, fibers or a fiber aggregate such as paper, a granular material such as silicon, or the like. Moreover, the substrate may be subjected to a surface treatment (e.g., hydrophilicity treatment which makes the surface hydrophilic), according to requirements.

Solution Application Method

In the metal pattern forming method according to an embodiment of the present invention, one of the metal salt solution and the acetyl compound solution is deposited by means of an inkjet method, thereby forming wires based on a metal pattern. The other of the two solutions may be deposited in accordance with the pattern by means of an inkjet method, or it may be applied over the whole surface by means of a bar coater, or the like. However, in order to be able to reduce the amount of liquid used, and to be able to achieve a uniform film thickness in the metal pattern, it is desirable to deposit both of the two solutions by means of an inkjet method.

Moreover, the sequence in which the solutions are applied (deposited) is not restricted (in other words, it is possible to apply (deposit) the metal salt solution first, or it is also possible to apply (deposit) the acetylene compound solution). It is desirable to apply heat after depositing the metal salt solution or after depositing both of the solutions.

By depositing the two solutions, namely, a metal salt solution and an acetylene compound solution, on the substrate, a metal salt monomer is formed on the substrate. Here, by carrying out further heating, a portion of the acetylene compound is decomposed due to the heat and a reducible group is generated. Due to this effect, the metal is reduced by the reducing group to form a metal precipitate, and hence a metal pattern composed of the metal precipitate can be formed. Moreover, in cases where the metal salt solution of the two solutions is applied on the substrate first, after depositing the metal salt solution on the substrate, it is possible to precipitate a metal salt on the substrate by applying heat. Once the metal salt has been precipitated onto the substrate, by depositing an acetylene compound solution, it is possible to promote a reaction generating metal acetylide on the substrate as well as precipitation of the metal. By this means, the metal can be precipitated at a low temperature, and it is possible to omit the heating step after the deposition of the two solutions.

The heating method employed may be heating by conduction via the rear surface of the substrate, or convection heating by supplying heated air, or heating by radiation or heating by laser.

Furthermore, when a solvent having a low boiling point is used in the metal salt solution, it is also possible to omit the heating step after the deposition of the metal salt solution. In this case, the solvent in the metal salt solution is removed by natural drying after the metal salt solution has been applied, and then the acetyl compound solution is deposited to form a metal pattern.

To summarize the foregoing, various sequences of the deposition steps and the drying step are described below. However, the present invention is not limited to these sequences described below. Below, solution 1 is the metal salt solution, solution 2 is the acetylene compound solution, IJ indicates deposition by an inkjet method and SC indicates application by spray coating.

(i) Firstly, the solution 1 is applied onto whole surface by SC, or the like, and then solution 2 is deposited by IJ to form a pattern. After the deposition of the solution 2, the substrate is heated to dry the solutions and to cause the reaction between the solutions 1 and 2.

(ii) Firstly, solution 2 is applied onto whole surface by SC, or the like, and then solution 1 is deposited by IJ to form a pattern. After the deposition of the solution 1, the substrate is heated to dry the solutions and to cause the reaction between the solutions 1 and 2.

(iii) Firstly, solution 1 is deposited onto a prescribed region of the substrate by IJ, and then solution 2 is deposited by IJ to form a pattern. After the deposition of the solution 2, the substrate is heated to dry the solutions and to cause the reaction between the solutions 1 and 2.

(iv) Firstly, solution 2 is deposited onto a prescribed region of the substrate by IJ, and then solution 1 is deposited by IJ to form a pattern. After the deposition of the solution 1, the substrate is heated to dry the solutions and to cause the reaction between the solutions 1 and 2.

(v) Solution 1 is applied onto whole surface by SC, or the like, and the substrate is then heated to dry the applied solution 1. After the heating of the substrate, solution 2 is deposited by IJ to form a pattern.

(vi) Solution 1 is deposited onto a prescribed region of the substrate by IJ, and the substrate is then heated to dry the deposited solution 1. After the heating of the substrate, solution 2 is deposited by IJ to form a pattern.

If a solvent having a low boiling point is used for the solution 1, then it is possible to omit the heating of the substrate after the deposition of the solution 1.

(vii) Firstly, solution 1 is applied onto whole surface by SC, or the like, and the applied solution 1 on the substrate is then naturally dried. After the natural drying of the applied solution 1, solution 2 is deposited by IJ to form a pattern.

(viii) Firstly, solution 1 is deposited onto a prescribed region of the substrate by IJ, and the deposited solution 1 on the substrate is then naturally dried. After the natural drying of the deposited solution 1, solution 2 is deposited by IJ to form a pattern.

The forming method according to the present invention is not limited to these sequences, and various other combinations may be adopted for the metal pattern forming method.

If patterning is carried out by deposition using an inkjet method after applying solution to the whole surface of the substrate as in (i) and (ii), and the like, then the solution to that is applied first will be remaining on the substrate even after the metal pattern is formed, but this can be removed by washing with the solvent of the solution which is applied first.

The heating temperature during the heating step is desirably not lower than 100° C. and not higher than 180° C. Furthermore, desirably, the heating time is between several seconds and approximately one minute. By satisfying these conditions of the heating step, it is possible to achieve drying by driving off the solvent of the solution rapidly, and therefore precipitation of the metal becomes possible. If the heating temperature is higher than 180° C., then it is difficult to apply this method when using substrates having poor resistance to heat, and this is undesirable.

As described above, the thickness of the metal pattern formed by inkjet deposition is extremely thin, since the ejected volume of the inkjet deposition method is small. Consequently, after forming a metal pattern by means of an inkjet method, it is desirable to perform a plating process, such as electroless plating, electrolytic plating, or the like.

It is possible to carry out the plating process by means of a known method. The metal contained in the plating bath is desirably nickel, aluminum, copper, silver, gold or palladium. If a copper plating bath is used as a plating bath, then a copper sulfate bath or a copper pyrophosphate bath, or the like, can be used. Furthermore, for a silver plating bath, it is possible to employ a general potassium silver cyanide bath. Desirably, the pH of the plating bath is 8 to 9, and the temperature of the plating bath is kept to 50° C. to 70° C. In the plating process, the film thickness of the metal pattern can be adjusted appropriately in accordance with the plating conditions and the material used, and hence the film thickness can be adjusted in the range of several μm to several tens of μm.

Figure 1B:
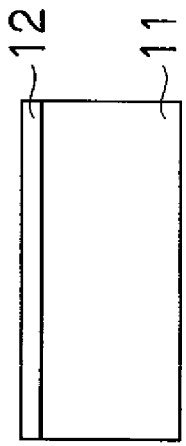
Figure 1C:
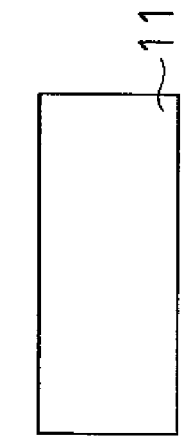
Figure 1D:
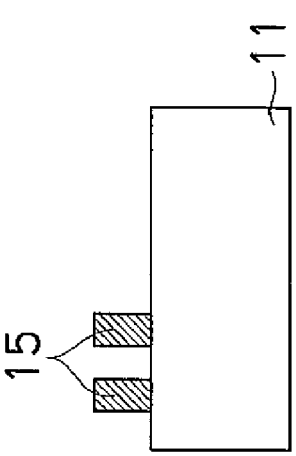
Figure 1E:
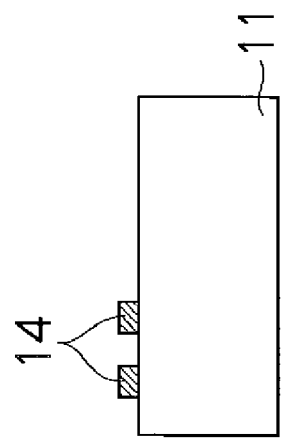
Figure 1F:
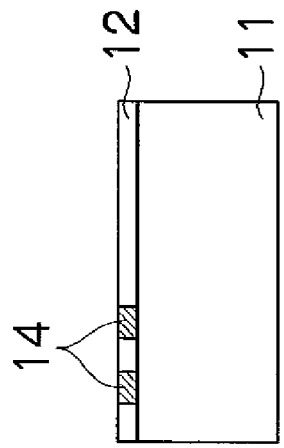

One example of the metal pattern forming method according to an embodiment of the present invention which follows the sequence indicated in (i) above is now described with reference to FIGS. 1A to 1F. Firstly, a metal salt solution 12 is applied onto the whole surface of a substrate 11 (shown in FIG. 1A) by a spray coater (shown in FIG. 1B). Next, an acetylene compound solution 13 is deposited by an inkjet method to form a pattern (shown in FIG. 1C). By drying the substrate by heating, the metal is caused to precipitate and a metal pattern 14 is obtained (shown in FIG. 1D). Thereupon, cleaning is carried out by using the solvent of the solution which is applied first, or the like, thereby removing unwanted metal salt solution 12 (shown in FIG. 1E), whereupon a metal pattern 15 having an increased film thickness can be obtained by means of a plating process (shown in FIG. 1F).

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A metal pattern forming method of forming a metal pattern on a substrate, the metal pattern forming method comprising the steps of:

applying one of a metal salt solution and an acetylene compound solution onto the substrate, the acetylene compound solution containing an acetylene compound expressed by a general formula of:

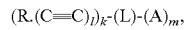

$(R\text{-}(C{\equiv}C)_l)_k\text{-}(L)\text{-}(A)_m,$ where R is one of a metal element, hydrogen, a carboxyl group or salt thereof, an alkyl group, a cycloalkyl group, an alkenyl group, an alkynyl group, an aryl group, an aralkyl group and a heterocyclic group, L is one of a compound linking A with a carbon-carbon triple bond and a group having (k+m) valency, A is one of a polyoxyether group, a polyaminoether group and polythioether group, k and l are integers not less than 1, and m is an integer not less than 0; and after the step of applying the one of the metal salt solution and the acetylene compound solution, applying the other of the metal salt solution and the acetylene compound solution onto the substrate so that the metal salt solution reacts with the acetylene compound solution to form a metal precipitate on the substrate, wherein at least one of the applying steps is performed by using an inkjet apparatus to directly form the metal pattern composed of the metal precipitate on the substrate.

2. The metal pattern forming method as defined in claim 1, wherein:

in the step of applying the one of the metal salt solution and the acetylene compound solution, the one of the metal salt solution and the acetylene compound solution is applied onto the substrate in a form of a thin film by using an application apparatus; and in the step of applying the other of the metal salt solution and the acetylene compound solution, the other of the metal salt solution and the acetylene compound solution is deposited onto the thin film by using the inkjet apparatus to form the metal pattern on the substrate.

3. The metal pattern forming method as defined in claim 1, further comprising the step of heating the substrate after the metal salt solution is applied on the substrate in one of the applying steps.

4. The metal pattern forming method as defined in claim 3, wherein in the step of heating the substrate, the substrate is heated at a temperature of 100° C. through 180° C. for one minute or less.

5. The metal pattern forming method as defined in claim 1, further comprising the step of performing a plating process after the metal precipitate is formed on the substrate, wherein the metal salt solution contains a metal element belonging to one of groups 8 to 10 in a periodic table.

* * * * *